United States Patent
Bakker et al.

(10) Patent No.: US 6,528,720 B1
(45) Date of Patent: Mar. 4, 2003

(54) ROTARY SEAL FOR EMI-IMPERMEABLE ENCLOSURE

(75) Inventors: Johan P. Bakker, Brighton, MI (US); Sammy C. Hutson, Novi, MI (US); Ronald L. Upton, Brighton, MI (US)

(73) Assignee: Unisys Corporation, Blue Bell, PA (US)

( * ) Notice: Subject to any disclaimer, the term of this patent is extended or adjusted under 35 U.S.C. 154(b) by 7 days.

(21) Appl. No.: 09/834,844

(22) Filed: Apr. 13, 2001

(51) Int. Cl.⁷ .................................................. H05K 9/00
(52) U.S. Cl. .................. 174/35 GC; 277/920
(58) Field of Search ............... 174/35 GC, 35 R; 361/818, 800; 277/920

(56) References Cited

U.S. PATENT DOCUMENTS 5,256,833 A * 10/1993 Schwenk .................. 174/35 R

* cited by examiner

Primary Examiner—Hung V. Ngo
(74) Attorney, Agent, or Firm—Harness Dickey & Pierce, P.L.C.; Lisa A. Rode; Mark T. Starr (57) ABSTRACT

In an enclosure having an interface between a fixed portion and a movable portion, an EMI seal mechanism comprises a support mechanism coupled to one of the fixed portion and the movable portion. The support mechanism is positionable from an electrically non-conductive position to an electrically conductive position, wherein the electrically conductive position provides a substantially continuous electrical connection through the enclosure.

14 Claims, 7 Drawing Sheets

ROTARY SEAL FOR EMI-IMPERMEABLE ENCLOSURE

BACKGROUND OF THE INVENTION

1. Field of the Invention

This invention relates generally to enclosures for electronic equipment, and more particularly, to the sealing of these types of enclosures for preventing the emission and/or entry of electro magnetic and/or radio frequency interference.

2. Discussion

Functioning electronic devices are known to produce electromagnetic interference (EMI) and radio-frequency interference (RFI) emissions. These emissions radiate outwardly from the electronic device and may cause interference with or failure of surrounding electronic equipment. Conversely, the electronic device may be damaged or disrupted by incoming EMI and/or RFI emissions produced by the nearby electronic equipment. As such, electronic devices are typically subject to government regulations related to outgoing levels of, and susceptibility, to EMI and RFI radiation. Therefore, such equipment and systems must be designed to be in compliance with the standards set forth by the government.

A conventional approach to reducing both emissions of, and susceptibility to, EMI and RFI is to enclose the electronic device in a continuous, electrically-conductive enclosure which is connected to earth ground potential. Such an enclosure, known in the art as a "Faraday cage", intercepts EMI and RFI radiation, whether emitted or received, and converts it to electrical currents at the surface of the enclosure. The currents then pass to earth ground without harmful effects according to electromagnetic effects which are well-known in the art. Such enclosures need not be truly continuous in their construction. Some apertures in the enclosure may be tolerated depending upon the size of the aperture and its relation to the frequency or frequencies of the radiation being attenuated. In general, the higher the frequencies, the smaller the size of the aperture which may be tolerated. In this manner, necessary openings, such as for air cooling, may be designed into the enclosure without unacceptably comprising the attenuation characteristics of the structure.

The construction of such an enclosure, including the methods by which parts of the enclosure are formed and attached together, has an impact on the attenuation which can be performed. Ideally, all parts of the enclosure are continuously and invariably connected together by wide and homogenous conductive paths. Points of disruption in the continuous enclosure may form electrical defects having properties of capacitance and/or inductance. The effect of such defects may concentrate the flow of the aforementioned surface currents to an intensity sufficient to cause them to re-radiate from the surface. As such, an electrical defect in the enclosure may act as an antenna which concentrates and re-radiates the EMI or RFI radiation that had previously been attenuated. Thus, these defects may render the entire enclosure without effect.

A very common site for defects to occur is at points where portions of the enclosure are fastened or attached by separable connections. Connecting methods, such as the use of mechanical fasteners (e.g., screws and rivets) and intermittently-welded joints, offer opportunities for such electrical defects to occur, either in construction or in the course of time. These defects are especially prone to occur at joints or connections which are regularly separated, such as in the use of the device for service attention. Poorly designed separable connections between parts of the enclosure may degrade over time and use to the point where the entire enclosure becomes ineffective.

Even well-designed connections may be degraded over the course of time due to surface corrosion. Specifically, oxide layers may form on the surfaces of mating parts. Metallic oxides act as dielectric materials and can cause a capacitor to form at the connection. As previously described, a re-radiating defect may result. For this reason, costly non-corrosive metals such as gold, silver and nickel are often used at the joints and separable connections of enclosures.

A more significant problem in the construction of such enclosures involves the use of large openings for functional or regular service access. Such openings typically require some form of closure, such as a door or panel, to prevent the passage of EMI and RFI into or out of the enclosure. This closure must be designed and constructed so as to form an electrically-continuous part of the enclosure when secured in place. To this end, conductive means such as electrically-conductive compressible mesh, rubber gaskets, or flexible conductive "fingers" are conventionally used at the joints of the closure. Fastening means are used to install the closures in order to ensure continuous electrical contact at all points along its edges. The conductive means typically require considerable compressive forces between mating parts to obtain the desired conductive action, which only serves to increase the size and number of fastening means required to ensure a reliable connection. As such, a large removable closure, conductively sealed and attached by conventional means, may require the use of a fastener every one to two inches along its entire periphery. In the case of a suitable access closure for allowing upper-body access, this may result in a closure which requires a hundred or more fasteners to install, at great cost and labor expense.

The problem becomes even more acute in the case of highly-automated systems, where it is required that sealing closures be automatically opened and closed. This would be the case, for example, with a large automated test machine, which requires complete EMI/RFI shielding while it is in operation, but which also requires large removable closures in the EMI shield which can be opened to access the machine inside as for example, to load or unload the devices to be tested. In such cases, where the functions of the machine are entirely automated, the actions of opening, closing and electrically sealing the closures must also be powered and automated.

SUMMARY OF THE INVENTION

To address these and other difficulties, the present invention is directed toward an electrically-continuous EMI/RFI rotary seal system for closures in EMI-impermeable enclosures. Specifically, in an enclosure having an interface between a fixed portion and a movable portion, an EMI seal mechanism comprises a support mechanism coupled to one of the fixed portion and the movable portion. The support mechanism is positionable from an electrically non-conductive position to an electrically conductive position, wherein the electrically conductive position provides a substantially continuous electrical connection through the joint between the enclosure parts.

In addition, rotary action of the support mechanism ensures that with each cycle of the device, a frictional force is generated between conductive elements and their respective contact surfaces. This force is tangential to the ends of the various fingers, thus generating a wiping or cleaning action on both the fingers and the contact surfaces. This action eliminates the formation of an oxide film and ensures continued electrical contact without degradation.

BRIEF DESCRIPTION OF THE PREFERRED EMBODIMENTS

Additional objects, features, and advantages of the present invention will become apparent from studying the following detailed description and claims when taken in conjunction with the accompanying drawings, in which:

DETAILED DESCRIPTION OF THE PREFERRED EMBODIMENTS

The drawings show merely exemplary embodiments of the present invention for purposes of illustration only, and one skilled in the art will readily recognize that the principles of the invention are well adapted for application to devices other than EMI impermeable enclosures as well as to EMI-impermeable enclosures other than the one shown in the drawings. Furthermore, one skilled in the art will readily appreciate that various adaptations of the preferred embodiments may be combined or otherwise modified without departing from the scope of the invention.

Figure 1:
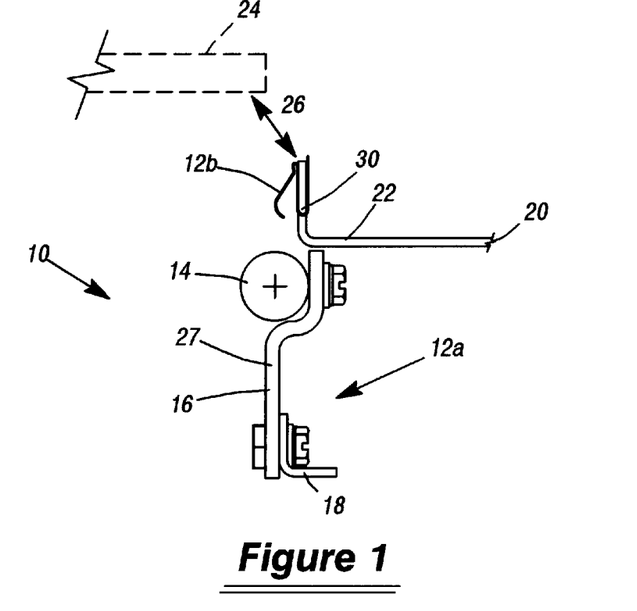
FIG. 1 is a plan view of a preferred embodiment of the EMI seal mechanism in a disengaged position according to the principles of the present invention.

FIG. 1 shows a preferred embodiment of the present invention in a disengaged position. As shown, the arrangement 10 of the present invention includes a support mechanism 12a and a contact element 12b. The support mechanism 12a in turn includes a shaft assembly 14, a plurality of bracket assemblies 16 and a plurality of conductive members 18. Although the shaft 14 is shown having a cylindrical crosssectional shape, the shaft 14 may have any number of cross-sectional shapes, such as triangular or square according to the particular requirements of the embodiment. The shaft 14 is mounted to the inside of an enclosure 20. The enclosure 20 includes a fixed portion 22 and a movable portion 24. For exemplary purposes, the movable portion 24 may take the form of a demountable closure panel or door. A linear joint, or interface 26, is formed between the fixed portion 22 and the movable portion 24. The position of the axis of the shaft 14 is parallel to and offset from the linear joint.

The plurality of bracket assemblies 16 are attached tangentially to the length of the shaft 14. Each bracket assembly 16 includes a planar member 27. The bracket assemblies 16 are attached to the shaft 14 by a suitable fastening means, such as bolts, rivets, or adhesive or similar means as known to those skilled in the art.

Figure 3:
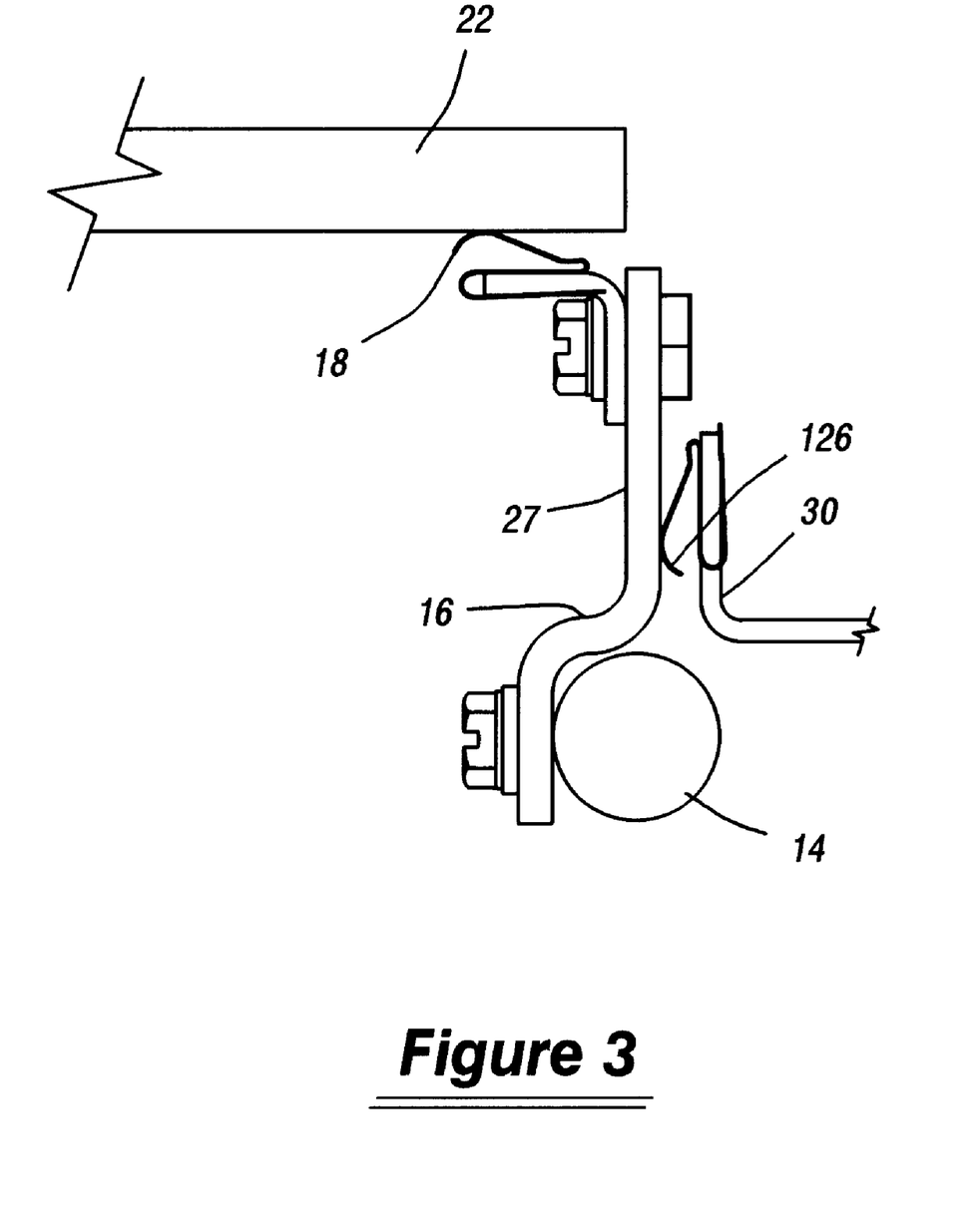
FIG. 3 illustrates a plan view of the EMI seal mechanism of FIG. 1, wherein the EMI seal mechanism is in an engaged position.

A flange 30 is constructed as part of the interior edge of the fixed portion 24 of the enclosure adjacent to the edge of the closure panel 22 (FIG. 3). The flange 30 is attached to the fixed portion 24 by a suitable fastening means, such as bolts, rivets, or adhesive or similar means.

As shown in FIG. 1, the plurality of conductive members 18 preferably take the form of a plurality of flexible, conductive fingers. A first plurality of these individual flexible, conductive fingers 18 are attached to the plurality of bracket assemblies 16. Preferably, each flexible finger is formed of a metallic material, however any other suitable conductive material may be used. It should be understood that the flexible metallic fingers may alternatively be mounted to the closure panel 22 or to the flange 30. As best shown in FIG. 3, the first plurality of conductive fingers 18 are arranged so as to contact the edge of the interior face of the closure panel 22.

As shown, as with the conductive members 18, the contact element 12b takes the form of a plurality of fixed conductive fingers attached to the flange 30. Preferably, each flexible finger is formed of a metallic material, however any other suitable conductive material may be used. The plurality of fixed conductive fingers 12b are arranged so as to contact the planar member 27 of the bracket assembly 16 at the same time that the first plurality of conductive fingers 18 contacts the closure panel 22.

Figure 2:
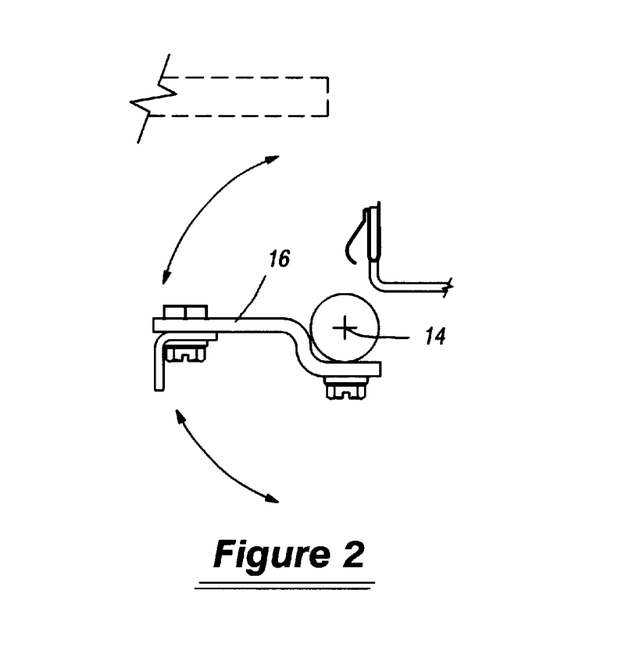
FIG. 2 illustrates a plan view of the EMI seal mechanism of FIG. 1, wherein the EMI seal mechanism is in transition between a disengaged position and an engaged position.

As best shown in FIG. 2, during operation, the shaft 14 is rotated in a clock-wise manner. Accordingly, the attached plurality of bracket assemblies 16 also rotate. FIG. 3 depicts the preferred embodiment of the present invention in the engaged position. As such, the first plurality of conductive fingers 18 make contact with the inside surface of the closure panel 22 while, simultaneously, the plurality of fixed conductive fingers 12b make contact with the planar member 27 of the bracket assembly 16.

Figure 4:
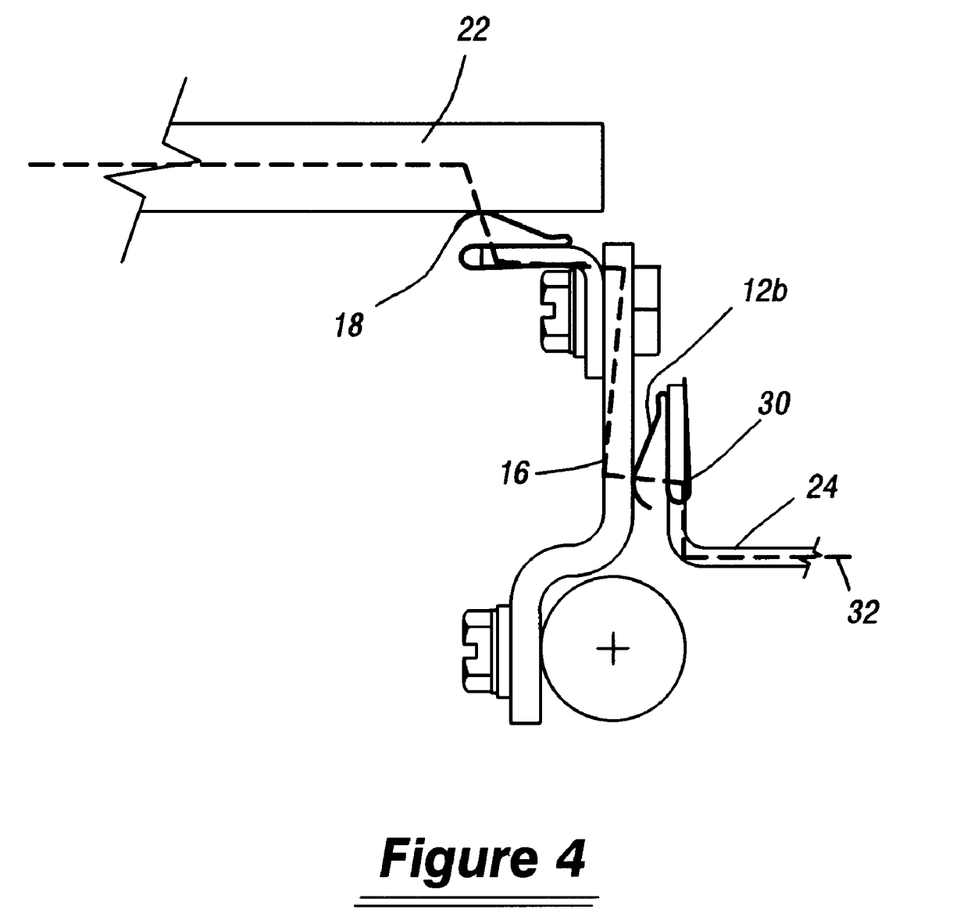
FIG. 4 is a plan view of the EMI seal mechanism of FIG. 3 depicting the path of electrical current therethrough.

Accordingly, as shown in FIG. 4, a continuous conductive path 32 is formed through the fixed portion 24 and the movable portion 22. The path allows electric current to pass through the fixed portion 24, the flange 30, the plurality of fixed conductive fingers 12b and the plurality of bracket assemblies 16. Current then travels from the bracket assemblies 16 through the first plurality of conductive fingers 18 to the inside surface of the closure panel 22. In this condition, the closure panel 22 is sealed electrically by the electrically continuous connection with the fixed portion 24.

If the shaft 14 is then rotated in a counter-clockwise manner, the plurality of bracket assemblies 16 again rotates with it, and the first plurality of conductive fingers 18 and the plurality of fixed conductive fingers 12b are disconnected from their respective contact surfaces. The plurality of bracket assemblies 16 thus move away from the closure panel 22, but within the compass of the opening which is created when the closure panel 22 is removed.

The rotary action described ensures that with each cycle of the device, a frictional force is generated between the first plurality of conductive fingers 18 and the plurality of fixed conductive fingers 12b and their respective contact surfaces. This force is tangential to the ends of the various fingers, thus generating a wiping or cleaning action on both the fingers and the contact surfaces. This action eliminates the formation of an oxide film and ensures continued electrical contact without degradation.

Figure 5:
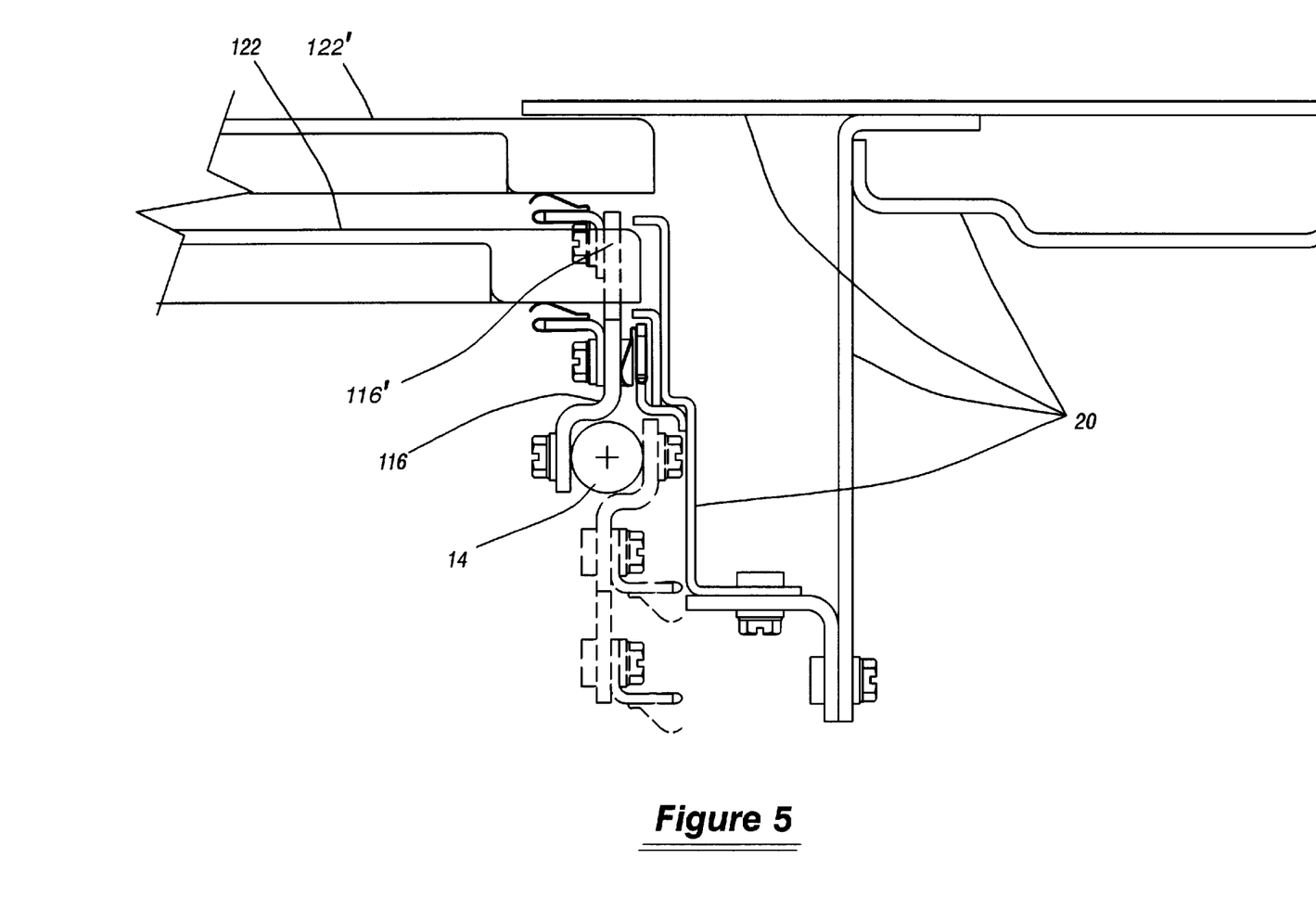
FIG. 5 illustrates a plan view of another preferred embodiment of the EMI seal mechanism according to the principles of the present invention.

FIG. 5 illustrates another preferred embodiment of the arrangement according to the principles of the present invention in which components that are similar to those described with reference to the first preferred embodiment are annotated with similar reference numerals incremented by 100.

As shown in FIG. 5, the present invention may be used with a plurality of movable portions which have different depths relative to the outside surface of the enclosure 20. FIG. 5 illustrates an example in which first closure panel 122 and second closure panel 122' are designed to slide on rails. These panels have different depths relative to the face of the enclosure, thereby allowing each panel to pass in front of or behind the adjacent panel.

Figure 6:
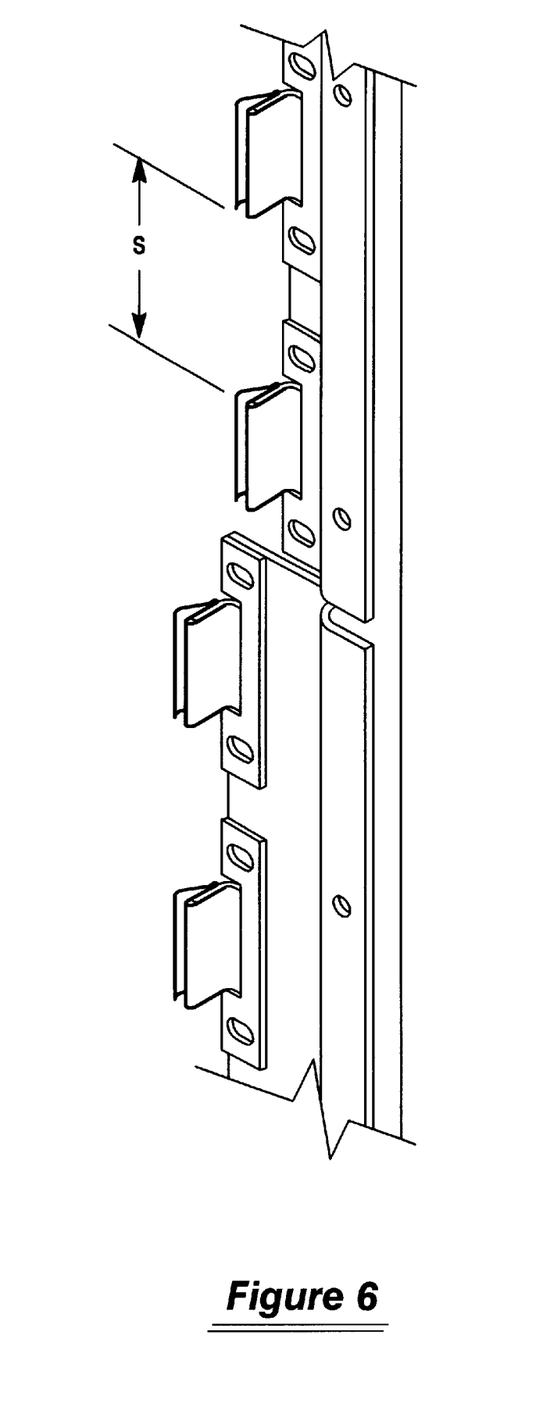
FIG. 6 is a partial perspective view of the preferred embodiment shown in FIG. 5.
Figure 7:
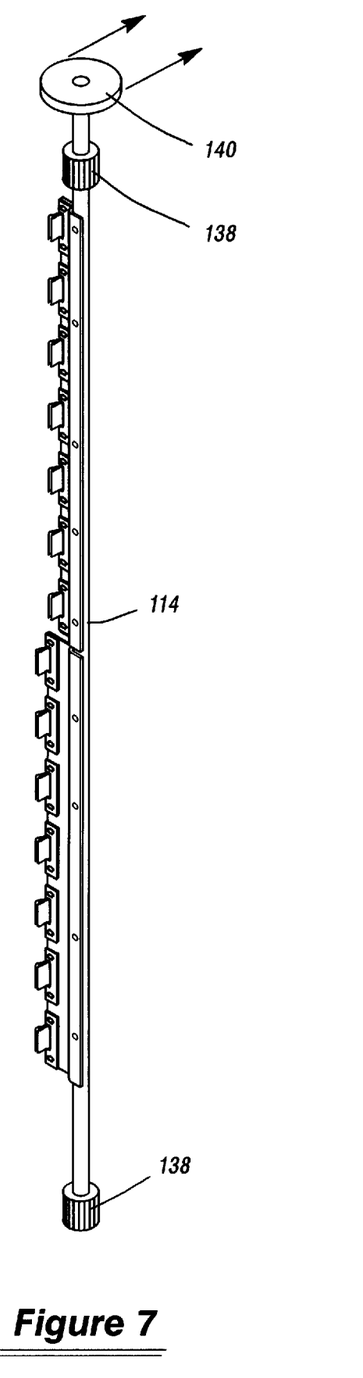
FIG. 7 is a perspective view of the preferred embodiment of FIG. 5 further comprising a drive device according to the principles of the present invention.

As shown in FIGS. 5–7, a second plurality of bracket assemblies 116' is mounted to the shaft 14 in a manner similar to the first plurality of bracket assemblies 116 previously described. The second plurality of bracket assemblies 116' and the first plurality of bracket assemblies 116 have different lengths. The length of each of the first plurality of bracket assemblies 116 corresponds to the relative depth of the first closure panel 122, while the length of each of the second plurality of bracket assemblies 116' corresponds to the relative depth of the second closure panel 122'.

As best shown in FIG. 6, in this arrangement, any space S between the ends of individual bracket assemblies should be kept smaller than the maximum enclosure opening permitted based upon the frequency of radiation to be attenuated. It should be understood that a single continuous bracket assembly (not shown) could alternatively be used in place of the plurality of individual brackets.

As shown in FIG. 7, the shaft 114 in each of the preferred embodiments of the present invention is preferably mounted in rotary bearings 138 so that the shaft 114 may rotate. While the embodiment of FIG. 7 uses only two bearings 138, one at each of shaft 114, those skilled in the art will understand that the shaft may be mounted in a plurality of bearings, as required by the length, weight and stiffness of the shaft. The shaft 114 is also provided at one of its ends with a suitable rotary power source 140 which is so mounted and arranged as to rotate the shaft 114 between the limits of a fixed angle of rotation.

Figure 8:
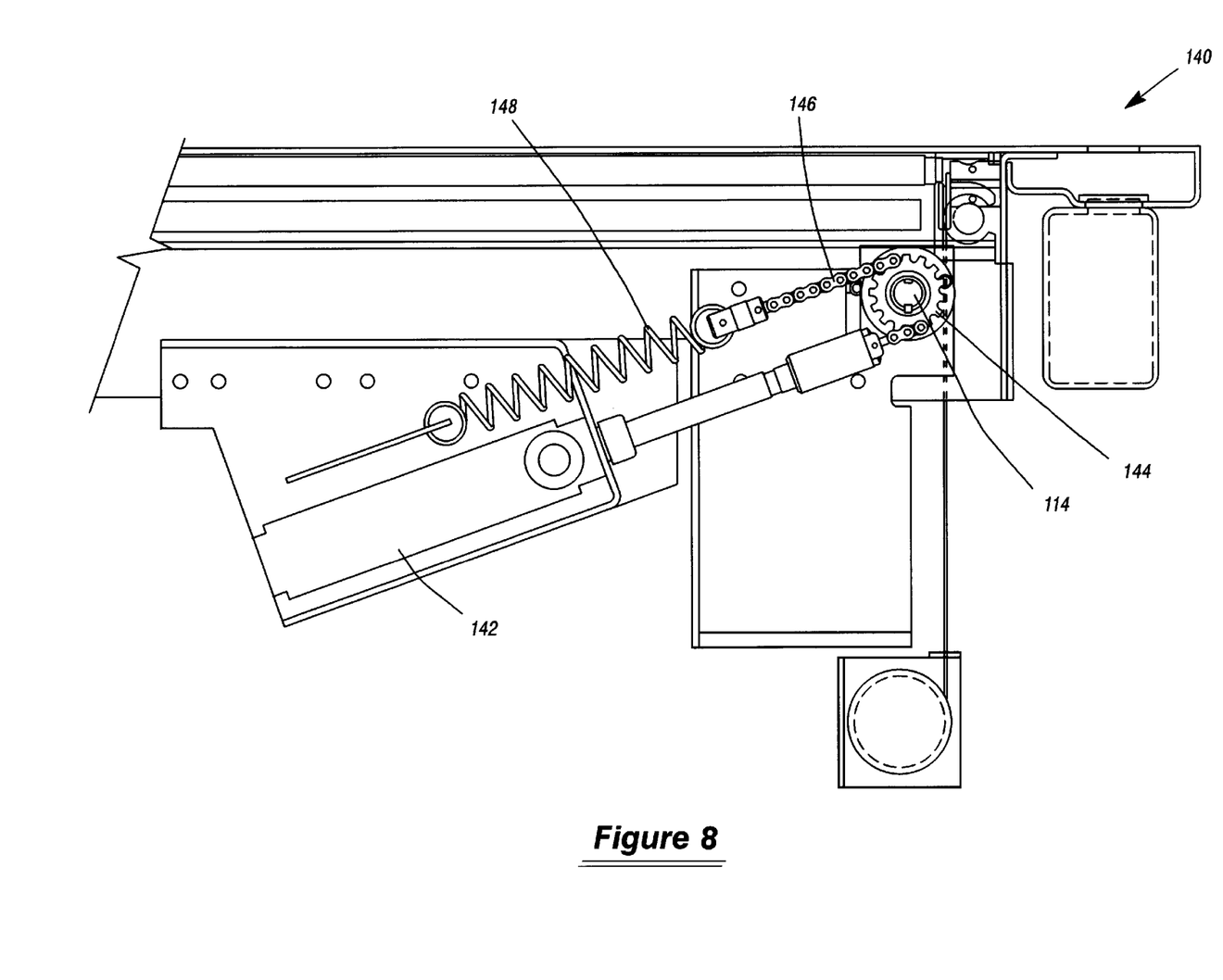
FIG. 8 is a plan view of a preferred embodiment of a drive device according to the principles of the present invention.

FIG. 8 illustrates a preferred embodiment of the rotary power source 140. This power source 140 consists of a pneumatic cylinder 142 arranged to drive a rotary sprocket 144 mounted on the end of the shaft 114 by means of a flexible drive chain 146. An extension spring 148 is positioned at the opposite end of the chain 146 to provide a restoring force and rotate the shaft 114 in the opposite direction. It should be understood that this arrangement is merely one of a plurality of arrangements which could be designed to drive the shaft 114. Alternatively, an electric motor (with or without a gearbox) could be used.

It may thus be seen that the EMI seal mechanism provides a conductive seal throughout the enclosure. Specifically, in an enclosure having an interface between a fixed portion and a movable portion, an EMI seal mechanism comprises a support mechanism coupled to one of the fixed portion and the movable portion. The support mechanism is positionable from an electrically non-conductive position to an electrically conductive position, wherein the electrically conductive position provides a substantially continuous electrical connection through the enclosure.

In addition, the rotary action described ensures that with each cycle of the device, a frictional force is generated between the pluralities of conductive fingers and the plurality of fixed conductive fingers and their respective contact surfaces. This force is tangential to the ends of the various fingers, thus generating a wiping or cleaning action on both the fingers and the contact surfaces. This action eliminates the formation of an oxide film and ensures continued electrical contact without degradation.

The foregoing discussion and drawings disclose and describe merely exemplary embodiments of the present invention. One skilled in the art will readily recognize from such discussion that various changes, modifications and variations may be made therein without departing from the scope of the invention as defined in the following claims.

What is claimed is:

1. In an enclosure having a fixed portion, a first movable portion, a first interface formed between the fixed portion and the first movable portion, a second movable portion, a second interface formed between the fixed portion and the second movable portion, and an EMI seal mechanism, the EMI seal mechanism comprising:

a plurality of fixed conductive fingers adapted for coupling to the fixed portion; and,
   a support mechanism including:
      a cylindrical shaft having a first end and a second end, each of said ends being mounted to the enclosure and adapted to extend generally parallel to the entire first interface; and,
      a first plurality of bracket assemblies tangentially mounted to a section of said shaft and a first plurality of conductive fingers individually attached to said first plurality of bracket assemblies, said support mechanism being rotatably positionable between a first position and a second position, wherein said first position provides for said first plurality of bracket assemblies to be disengaged from said plurality of fixed conductive fingers and said first plurality of conductive fingers to be disengaged from the first movable portion, and wherein said second position provides for said first plurality of bracket assemblies to be engaged with said plurality of fixed conductive fingers and said first plurality of conductive fingers to be engaged with the first movable portion such that a continuous, electrically conductive seal is formed therebetween.

2. The EMI seal mechanism of claim 1, wherein said support mechanism further includes a second plurality of bracket assemblies tangentially mounted to a section of said shaft, said second plurality of bracket assemblies being adapted to extend further from said shaft relative to said first plurality of bracket assemblies.

3. The EMI seal mechanism of claim 2, wherein said support mechanism further includes a second plurality of conductive fingers individually coupled to said second plurality of bracket assemblies.

4. The EMI seal mechanism as of claim 2, whereby said support mechanism is rotatably positionable between a first position wherein said support mechanism is disengaged from said first plurality of fixed conductive fingers, the first movable portion and the second movable portion and a second position wherein said support mechanism is engaged with said plurality of fixed conductive fingers and the first movable portion such that a continuous, electrically conductive seal is formed therebetween.

5. In an enclosure having a fixed portion, a plurality of movable portions, and an EMI seal mechanism, the EMI seal mechanism comprising:

a support mechanism coupled to one of the fixed portion and the plurality of movable portions, the support mechanism being positionable between a first position in which said support mechanism is disengaged from the other of the fixed portion and the plurality of movable portion and a second position in which said support mechanism is engaged with the fixed portion and the plurality of movable portions such that a continuous, electrically conductive seal is formed therebetween, wherein said support mechanism comprises:

a shaft having a first end and a second end, said shaft extending generally parallel to the entire interface between the fixed portion and the plurality of movable portions;

a plurality of bracket assemblies attached tangentially to said shaft; and     a plurality of conductive fingers individually attached to said plurality of bracket assemblies.

6. The EMI seal mechanism of claim 5, wherein said plurality of conductive fingers engage one of the movable portions when in said second position.

7. The EMI seal mechanism of claim 6, wherein the plurality of conductive fingers are formed from a metallic material.

8. The EMI seal mechanism of claim 5, further comprising a contact element adapted to attach to the fixed portion.

9. The EMI seal mechanism of claim 8, wherein said contact element engages said bracket assembly when in said second position.

10. The EMI seal mechanism of claim 9, wherein said contact element includes a plurality of fixed conductive fingers.

11. The EMI seal mechanism of claim 5, further comprising a rotary drive mechanism coupled to said shaft for providing a torque thereto.

12. The EMI seal mechanism of claim 11, wherein said rotary drive mechanism includes:

a drive gear mounted on an end of said shaft;

a flexible drive chain connected to said drive gear, said drive chain having a first end and a second end;

a pneumatic cylinder connected to said first end of said drive chain and providing power thereto; and,     an extension spring at the second end of said chain, wherein said pneumatic cylinder provides a force for rotating said shaft in a first direction, and wherein said extension spring provides a restoring force for rotating said shaft in a second direction.

13. The EMI seal mechanism of claim 5, wherein at least one rotary bearing is mounted at each end of said shaft.

14. In an enclosure having an interface between a fixed portion and at least one movable portion, an EMI seal mechanism comprising:

a support mechanism adapted for coupling to one of the fixed portion and the movable portion, said support mechanism being positionable from an electrically non-conductive position to an electrically conductive position with respect to one of the fixed portion and the movable portion, wherein said electrically conductive position provides a substantially continuous electrical connection along the interface, wherein said support mechanism further comprises:

a shaft a first end and a second end, said shaft extending generally parallel to the entire interface between the fixed portion and the plurality of movable portions;

a plurality of bracket assemblies attached tangentially to said shaft; and     a plurality of conductive fingers individually to said plurality of bracket assemblies.

\* \* \* \* \*